United States Patent
Gajendra

(10) Patent No.: US 9,218,996 B2
(45) Date of Patent: Dec. 22, 2015

(54) SUBSTRATE POSITION ALIGNER

(71) Applicant: Applied Materials, Inc., Santa Clara, CA (US)

(72) Inventor: Manoj A. Gajendra, Bangalore (IN)

(73) Assignee: Applied Materials, Inc., Santa Clara, CA (US)

( * ) Notice: Subject to any disclaimer, the term of this patent is extended or adjusted under 35 U.S.C. 154(b) by 73 days.

(21) Appl. No.: 14/195,343

(22) Filed: Mar. 3, 2014

(65) Prior Publication Data

US 2014/0271085 A1 Sep. 18, 2014

Related U.S. Application Data

(60) Provisional application No. 61/792,705, filed on Mar. 15, 2013.

(51) Int. Cl.
*H01L 21/68* (2006.01)
*H01L 21/67* (2006.01)

(52) U.S. Cl.
CPC ........ *H01L 21/681* (2013.01); *H01L 21/67242* (2013.01); *H01L 21/68* (2013.01); *Y10S 414/136* (2013.01)

(58) Field of Classification Search
CPC ... H01L 21/681; H01L 21/68; Y10S 414/136; B65G 47/24
USPC ..................... 144/248.5; 198/394; 242/595.1; 250/559.29; 356/621; 414/433, 757, 414/936; 700/57; 901/47
See application file for complete search history.

(56) References Cited

U.S. PATENT DOCUMENTS

| | | | | |
|---|---|---|---|---|
| 3,964,957 A | * | 6/1976 | Walsh | 156/345.23 |
| 4,441,853 A | * | 4/1984 | Kosugi | 414/757 |
| 4,765,793 A | * | 8/1988 | Goddeau | 414/416.01 |
| 4,813,840 A | | 3/1989 | Prabhakar et al. | |
| 4,887,904 A | * | 12/1989 | Nakazato et al. | 356/621 |
| 5,028,200 A | * | 7/1991 | Shimane | 414/757 |
| 5,159,202 A | * | 10/1992 | Ametani | 250/559.22 |
| 5,183,378 A | | 2/1993 | Asano et al. | |
| 5,194,743 A | * | 3/1993 | Aoyama et al. | 250/548 |
| 5,211,794 A | * | 5/1993 | Enomoto et al. | 156/345.23 |

(Continued)

FOREIGN PATENT DOCUMENTS

JP H08-288370 A 11/1996

OTHER PUBLICATIONS

International Search Report and Written Opinion dated Jun. 18, 2014.

*Primary Examiner* — Gregory Adams
(74) *Attorney, Agent, or Firm* — Patterson & Sheridan, LLP

(57) ABSTRACT

A substrate position aligner includes a substrate holding assembly, a plurality of rollers, a rotation mechanism, and a sensor. The substrate holding assembly is configured to hold a substrate in a vertical orientation. The plurality of rollers include at least two idler rollers and a drive roller. Each roller has a point on its perimeter spaced on a common radius from a center of substrate rotation defined within the substrate holding assembly. The sensor is positioned approximately on the common radius and configured to detect the presence of an orientation cut in the substrate when the orientation cut is not orientated within a range between about −44 degrees and about +44 degrees from horizontal. A method of aligning a substrate having an orientation cut includes sensing a presence of the orientation cut when the orientation cut is not orientated within the above recited range.

20 Claims, 4 Drawing Sheets

(56) References Cited

U.S. PATENT DOCUMENTS

| | | | |
|---|---|---|---|
| 5,238,354 A * | 8/1993 | Volovich | 414/779 |
| 5,239,182 A * | 8/1993 | Tateyama et al. | 250/559.37 |
| 5,258,823 A * | 11/1993 | Akamatsu | 356/615 |
| 5,340,437 A * | 8/1994 | Erk et al. | 438/747 |
| 5,513,948 A * | 5/1996 | Bacchi et al. | 414/783 |
| 6,302,317 B1 * | 10/2001 | Narita et al. | 228/254 |
| 6,400,445 B2 * | 6/2002 | Nishi et al. | 355/72 |
| 6,499,367 B1 * | 12/2002 | Saeki | 73/865.9 |
| 7,315,373 B2 * | 1/2008 | Fukuzaki et al. | 356/399 |
| 8,700,206 B2 * | 4/2014 | Arai | 700/229 |
| 2002/0034434 A1 | 3/2002 | Hong et al. | |
| 2004/0247424 A1 | 12/2004 | Blattner | |

* cited by examiner

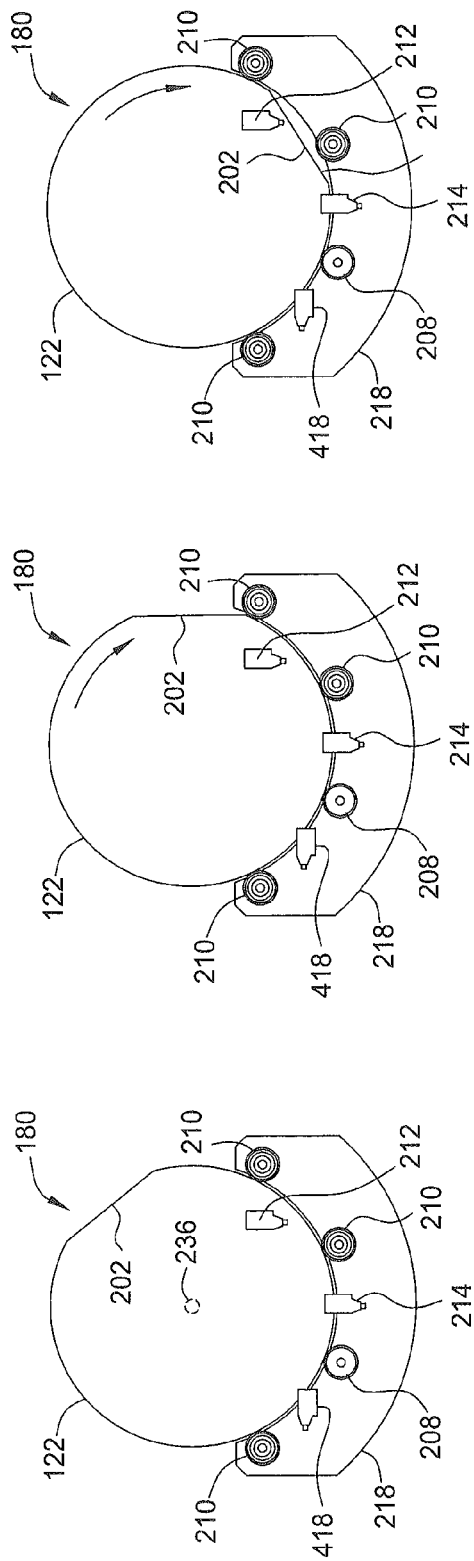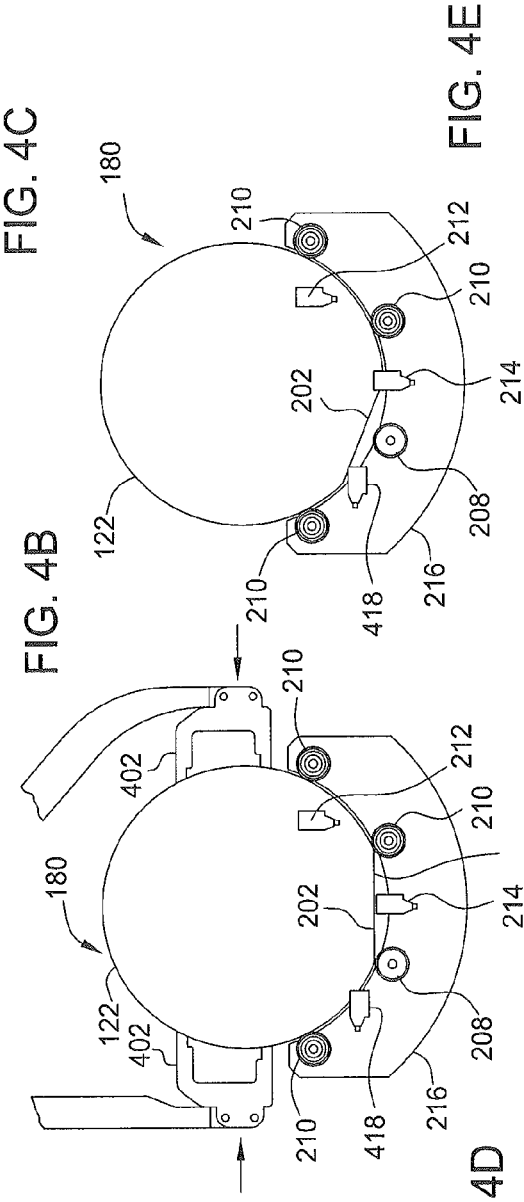

SUBSTRATE POSITION ALIGNER

CROSS-REFERENCE TO RELATED APPLICATIONS

This application claims priority to U.S. Provisional Patent Application Ser. No. 61/792,705, filed on Mar. 15, 2013, which is incorporated by reference in its entirety.

BACKGROUND OF THE INVENTION

1. Field of the Invention

Embodiments of the invention relate to a substrate position aligner. More specifically, embodiments disclosed relate to methods and apparatus for aligning vertical substrates.

2. Description of the Related Art

Substrate handlers are commonly used in semiconductor manufacturing in order to transfer substrates through the various processes of manufacturing. The substrate handlers typically include transfer robots with substrate grippers for holding the substrate by the substrate's edge. However, substrates often include a cut, such as a flat or notch, made into one or more sides to indicate the crystal orientation, and in some instances the doping orientation, of the substrate. As such, in vertical orientation processes, for example cleaning modules in chemical mechanical polishing (CMP) systems, the orientation cut in the substrate may interfere with the substrate gripper causing the substrate to be improperly held or even dropped. This poses a challenge, particularly in the processing of 150 mm substrates, where the length of the orientation cut is long relative to the substrate diameter, thus making it both difficult to rotate the substrate on center, and to properly grip the substrate while avoiding the orientation cut.

Thus, there is a need for methods and apparatus for improving the ability of substrate grippers to hold vertical substrates.

SUMMARY OF THE INVENTION

Methods and apparatus for a substrate position aligner are provided which improve the ability of a substrate gripper to hold a vertical substrate. In one embodiment, a substrate position aligner includes a substrate holding assembly, a plurality of rollers, a rotation mechanism, and a sensor. The substrate holding assembly is configured to hold a substrate in a vertical orientation. The plurality of rollers include at least two idler rollers and a drive roller. Each roller has a point on its perimeter spaced on a common radius from a center of substrate rotation defined within the substrate holding assembly. The rotation mechanism is configured to selectively rotate the drive roller. The sensor is positioned approximately on the common radius and configured to detect the presence of an orientation cut in the substrate when the orientation cut is not orientated within a range between about −44 degrees and about +44 degrees from horizontal.

In another embodiment, a substrate aligner includes a substrate holding assembly, at least three idler rollers and a drive roller, a rotation mechanism, and a first, second and third sensor. The substrate holding assembly is configured to hold a substrate in a vertical orientation and has a center of substrate rotation defined within the substrate holding assembly. Each of the rollers has a point on its perimeter that is spaced on a common radius from the center of substrate rotation. The rotation mechanism is configured to rotate the drive rollers. The first sensor is configured to detect the substrate when located in the substrate holding assembly. The second sensor and third sensor are each configured to detect a presence of an orientation cut in the substrate when the substrate is adjacent to or in a cut-down orientation.

In yet another embodiment, a method for aligning a substrate having an orientation cut includes placing the substrate on a plurality of rollers, wherein the rollers are distributed such that the substrate is supported on at least three rollers at all times. The method also includes sensing a presence of the substrate on the rollers, and sensing a presence of the orientation cut when the orientation cut is not orientated within a range between about −44 degrees and about +44 degrees from horizontal.

BRIEF DESCRIPTION OF THE DRAWINGS

So that the manner in which the above recited embodiments of the invention are obtained and can be understood in detail, a more particular description of the invention, briefly summarized above, may be had by reference to the embodiments thereof, which are illustrated in the appended drawings. It is to be noted, however, that the appended drawings illustrate only typical embodiments of the invention, and are therefore not to be considered limiting of its scope, for the invention may admit to other equally effective embodiments.

FIGS. 4A-4E are schematic views of an aligning process that may be practiced using the substrate position aligner of FIG. 2.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Embodiments of the present invention relate to a method and apparatus for a substrate position aligner. In one embodiment, the substrate position aligner may be used in a CMP system having a cleaning system that processes a vertically oriented substrate. However, it is contemplated that the substrate position aligner described herein may be suitable for other semiconductor manufactures process, and in particular, processes having a substrate in a vertical orientation.

Figure 1:
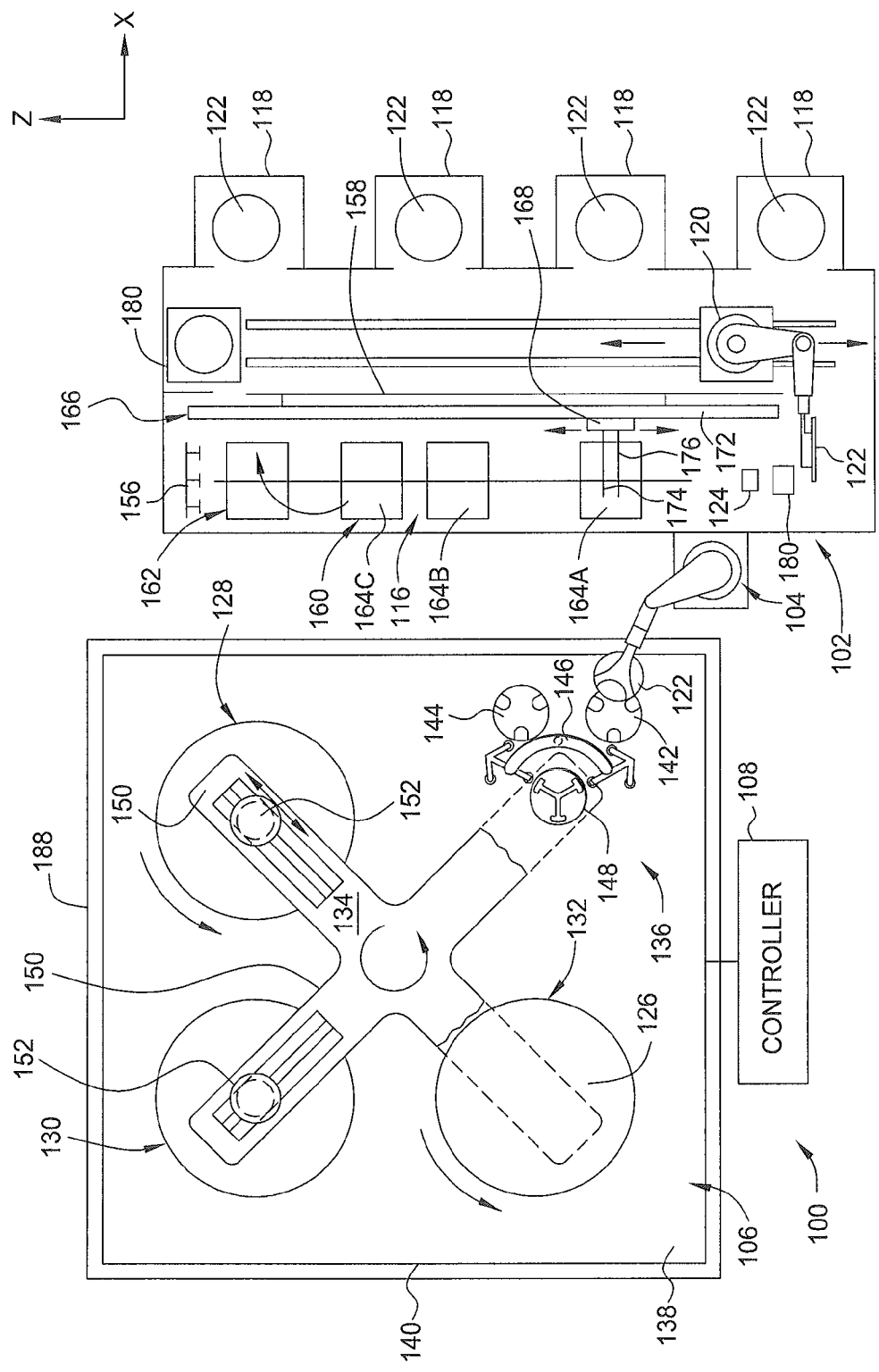
FIG. 1 illustrates a top view of a semiconductor substrate chemical mechanical planarization system which includes one embodiment of a substrate position aligner of the present invention.

FIG. 1 illustrates a top view of a semiconductor substrate chemical mechanical planarization (CMP) system 100 having a cleaning system 116 that includes one embodiment of a particle cleaning module 182. In addition to the cleaning system 116, the CMP system 100 generally includes a factory interface 102, a loading robot 104, and a planarizing module 106. The loading robot 104 is disposed proximate the factory interface 102 and the planarizing module 106 to facilitate the transfer of substrates 122 therebetween.

A controller 108 is provided to facilitate control and integration of the modules of the CMP system 100. The controller 108 is coupled to the various components of the CMP system 100 to facilitate control of, for example, the planarizing cleaning and transfer processes.

The factory interface 102 generally includes an interface robot 120, one or more substrate cassettes 118, and a substrate position aligner 180. The interface robot 120 is employed to transfer substrates 122 between the substrate cassettes 118, the cleaning system 116 and an input module 124. The input module 124 is positioned to facilitate transfer of substrates 122 between the planarizing module 106 and the factory interface 102. In one embodiment, the input module 124 is located adjacent the substrate position aligner 180 that is configured to position the substrate 122 after being transferred from the planarization module 106. Details of the substrate position aligner 180 will be discussed further below.

The planarizing module 106 includes at least one CMP station. It is contemplated that the CMP station maybe configured as an electrochemical mechanical planarizing station. In the embodiment depicted in FIG. 1, the planarizing module 106 includes a plurality of CMP stations, illustrated as a first station 128, a second station 130 and a third station 132 disposed in an environmentally controlled enclosure 188. In one embodiment, the first station 128, the second station 130 and the third station 132 include conventional CMP stations configured to perform a planarization process utilizing an abrasive containing polishing fluid. It is contemplated that CMP processes to planarize other materials may be alternatively performed, including the use of other types of polishing fluids. As the CMP process is conventional in nature, further description thereof has been omitted for the sake of brevity.

The planarizing module 106 also includes a transfer station 136 and a carousel 134 that are disposed on an upper or first side 138 of a machine base 140.

In one embodiment, the transfer station 136 includes an input buffer station 142, an output buffer station 144, a transfer robot 146 and a load cup assembly 148. The loading robot 104 is configured to retrieve substrates from the input module 124 and transfer the substrates to the input buffer station 142. The loading robot 104 is also utilized to return polished substrates from the output buffer station 144 to the input module 124, from where the polished substrates are then advanced through the cleaning system 116 prior to being returned to the cassettes 118 coupled to the factory interface 102 by the interface robot 120. The transfer robot 146 is utilized to move substrates between the buffer stations 142, 144 and the load cup assembly 148.

In one embodiment, the transfer robot 146 includes two gripper assemblies, each having pneumatic gripper fingers that hold the substrate by the substrate's edge. The transfer robot 146 may simultaneously transfer a substrate to be processed from the input buffer station 142 to the load cup assembly 148 while transferring a processed substrate from the load cup assembly 148 to the output buffer station 144. An example of a transfer station that may be used to advantage is described in U.S. Pat. No. 6,156,124, issued Dec. 5, 2000 to Tobin.

The carousel 134 is centrally disposed on the base 140. The carousel 134 typically includes a plurality of arms 150, each supporting a polishing head 152. Two of the arms 150 depicted in FIG. 1 are shown in phantom such that a planarizing surface of a polishing pad 126 of the first station 128 and the transfer station 136 may be seen. The carousel 134 is indexable such that the polishing head assemblies 152 may be moved between the planarizing stations 128, 130, 132 and the transfer station 136. One carousel that may be utilized to advantage is described in U.S. Pat. No. 5,804,507, issued Sep. 8, 1998 to Perlov, et al.

The cleaning system 116 removes polishing debris, abrasives and/or polishing fluid from the polished substrates that remains after polishing. The cleaning system 116 includes a plurality of cleaning modules 160, a substrate handler 166, a dryer 162 and an output module 156. The substrate handler 166 retrieves a processed substrate 122 returning from the planarizing module 106 from the substrate position aligner 180 adjacent the input module 124, and transfers the substrate 122 through the plurality of cleaning modules 160 and dryer 162. The dryer 162 dries substrates exiting the cleaning system 116 and facilitates substrate transfer between the cleaning system 116 and the factory interface 102 by the interface robot 120. The dryer 162 may be a spin-rinse-dryer or other suitable dryer. One example of a suitable dryer 162 may be found as part of the MESA™ or DESICA® Substrate Cleaners, both available from Applied Materials, Inc., of Santa Clara, Calif.

In the embodiment depicted in FIG. 1, the cleaning modules 160 utilized in the cleaning system 116 include a megasonic clearing module 164A, a first brush module 164B and a second brush module 164C. Each of the modules 160 is configured to process a vertically oriented substrate, i.e., one in which the polished surface is in a substantially vertical plane. The vertical plane is represented by the Y-axis, which is perpendicular to the X-axis and Z-axis shown in FIG. 1.

In operation, the CMP system 100 is initiated with the substrate 122 being transferred from one of the cassettes 118 to the input module 124 by the interface robot 120. The loading robot 104 then moves the substrate from the input module 124 to the transfer station 136 of the planarizing module 106. The substrate 122 is loaded into the polishing head 152 moved over and polished against the polishing pad 126 while in a horizontal orientation. Once the substrate is polished, polishing substrates 122 are returned to the transfer station 136 from where the robot 104 may transfer the substrate 122 from the planarizing module 106 to the input module 124. In one embodiment, the robot 104 may transfer the substrate to the input module 124 while rotating the substrate to a vertical orientation. The substrate handler 166 then retrieves the substrate 122 from the input module 124 and transfers the substrate through the cleaning modules 160 of the cleaning system 116. Each of the modules 160 is adapted to support a substrate in a vertical orientation throughout the cleaning process. Once cleaned, the cleaned substrate 122 is to the output module 156. The cleaned substrate 122 is returned to one of the cassettes 118 by the interface robot 120 while returning the cleaned substrate 122 to a horizontal orientation.

Although any suitable substrate handler may be utilized, the substrate handler 166 depicted in FIG. 1 includes a robot 168 having at least one gripper (two grippers 174, 176 are shown) that is configured to transfer substrates between the input module 124, the cleaning modules 160 and the dryer 162. Optionally, the substrate handler 166 may include a second robot (not shown) configured to transfer the substrate between the last cleaning module 160 and the dryer 162 to reduce cross contamination.

In the embodiment depicted in FIG. 1, the substrate handler 166 includes a rail 172 coupled to a partition 158 separating the cassettes 118 and interface robot 120 from the cleaning system 116. The robot 168 is configured to move laterally along the rail 172 to facilitate access to the cleaning modules 160, dryer 162 and the input and output modules 124, 156.

In one embodiment, the loading robot 104 is configured to transfer polished substrates 122 to the input module 124 in a horizontal orientation. The robot 168 is also configured to transfer substrates 122 to the substrate position aligner 180 while rotating the substrate 122 to a vertical orientation. In another embodiment, the loading robot 104 is configured to transfer polished substrates 122 directly to the substrate position aligner 180 while rotating the substrate 122 to a vertical orientation.

Figure 2:
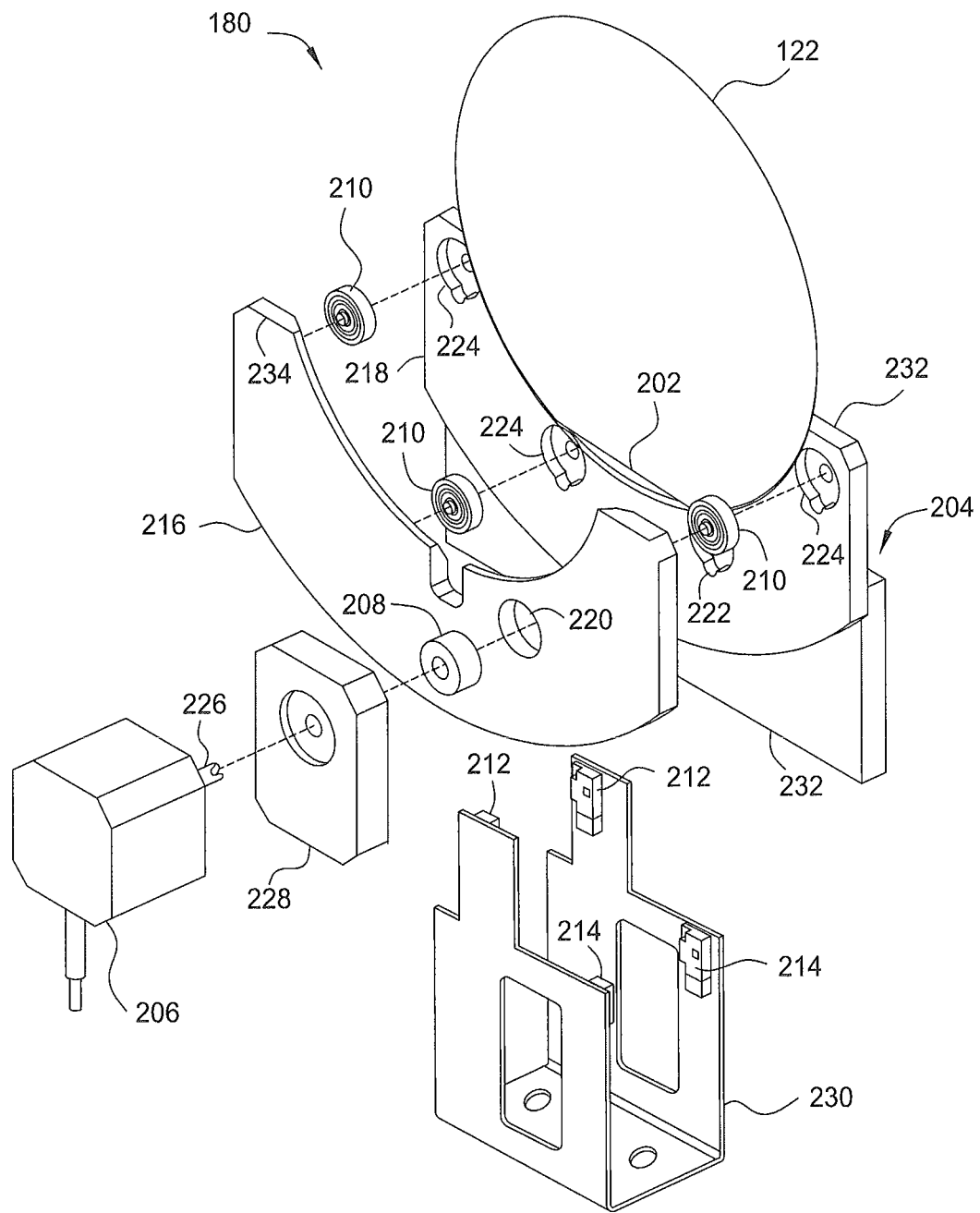
FIG. 2 is an exploded back side view of one embodiment of a substrate position aligner.

FIG. 2 illustrates an exploded view of one embodiment of the substrate position aligner 180. The substrate position aligner 180 is configured to position the substrate 122 (i.e., rotate the orientation of the substrate) such that an orientation cut 202, such as a notch or flat, is rotated into a known position, such as at the bottom of the substrate 122. In some embodiments the orientation cut 202 length is between about 52 mm to about 63 mm, for example 57 mm or 58 mm. However, the length of the orientation cut 202 may be any length suitable for the substrate size and is not limited to the above range. This advantageously allows the grippers 174, 176 of the robot 168 to properly grip the substrate 122 from the opposing lateral edges of the circumference of the substrate 122 while avoiding the orientation cut 202. While the substrate position aligner 180 is particularly beneficial for orienting substrates 122 oriented in a vertical position, as described herein, the substrate position aligner 180 is not limited in use to vertical orientation processes.

In one embodiment, the substrate position aligner 180 includes a substrate holder assembly 204, a substrate rotation mechanism 206, a drive roller 208, a plurality of idler rollers 210, a substrate presence sensor 212 and a primary orientation cut sensor 214. The substrate position aligner 180 may include a secondary orientation cut sensor 418 (shown in FIGS. 4A-4E). The substrate position aligner 180 may also include a water source (not shown) to keep the substrate 122 wet. The components of the substrate position aligner 180 may be fabricated from ceramic, polyetheretherketone, or any other materials suitable for wet processes.

The substrate holder assembly 204 has a crescent shaped body having a center of substrate rotation 236 defined by an arc defined by the idler rollers 210, which coincide with the center of the substrate 122 when disposed in the aligner 180. The substrate holder assembly 204 includes a first plate 216 and a second plate 218 configured to hold the substrate 122 therebetween in a substantially vertical orientation. The first plate 216 includes a first drive roller aperture 220 configured to house a portion of the drive roller 208. The second plate 218 has a second drive roller aperture 222 configured to house a portion of the drive roller 208. The first and second plates 216, 218 include a plurality of idler roller apertures 224 configured to house opposite ends of the idler rollers 210. The idler roller apertures 224 formed in the first plate 216 are hidden from view in FIG. 1. Additionally, the first and second plates 216, 218 include one or more drain holes 302 (shown in FIG. 3) formed therethrough to allow fluid in the substrate position aligner 180 to pass through substrate holder assembly 204.

The radial distance between at least one of the idler rollers 210 and the drive roller 208 may be selected to be greater than the length of the orientation cut 202, for which the substrate aligner 180 is designed. For example, for an orientation cut 202 having a length of about 58 mm, the radial distance between at least one of the idler rollers 210 and the drive roller 208 is between about 59 mm to about 65 mm, for example about 61 mm. The first plate 216 and the second plate 218 are coupled together by the drive roller 208 and the idler rollers 210 in their respective apertures 220, 222, 224. In one embodiment, both the drive and idler rollers, 208, 210 each have a point on the perimeter of the roller that is spaced from a common radius from the center of the substrate rotation 236. In one embodiment, the common radius is between about 65 mm to about 85 mm, for example about 75 mm In one embodiment, the first plate 216 may be coupled to a substrate position aligner bracket 232. The substrate position aligner bracket 232 is configured to couple the substrate position aligner 180 to the input module 124.

The substrate rotation mechanism 206 is configured to rotate the drive roller 208 which in turn rotates the substrate 122 on the idler rollers 210. The substrate rotation mechanism 206 may be a motor, an actuator or any other suitable mechanism for rotating the substrate 122. In one embodiment the substrate rotation mechanism 206 is a motor that is coupled to the drive roller 208 via a shaft 226. The substrate rotation mechanism 206 may be coupled to the first plate 216 via an optional motor bracket 228. The shaft 226 extends from the substrate rotation mechanism 206 through the motor bracket 228 and the first plate 216 to the drive roller 208.

While the embodiment depicted in FIG. 2 shows three idler rollers 210, the substrate position aligner 180 may be configured with any number of idler rollers 210. In one embodiment, the number of idler rollers 210 is selected based on the size of the substrate 122 and length of the orientation cut 202. For example, the substrate position aligner 180 includes at least three idler rollers 210 and one drive roller 208. In one embodiment, the substrate position aligner 180 includes at least three idler rollers 210 and one drive roller 208 for a 150 mm substrate. Optionally, one or more of the idler rollers 210 may be driven. In one embodiment, the drive and idler rollers 208, 210 are located in the substrate holder assembly 204 such that the drive and idler rollers 208, 210 are located below a horizontal diameter of the substrate 122 (shown in FIGS. 4A-4E).

The substrate presence sensor 212 is configured to detect the presence of the substrate 122 in the substrate holder assembly 204. The primary orientation cut sensor 214 is configured to detect the presence of the orientation cut 202 when located in front of the sensor 214. In one embodiment, the primary orientation cut sensor 214 is configured to detect the presence of the orientation cut when the orientation cut is not orientated within range between about −44 degrees and about +44 degrees from horizontal, e.g., between about −38 degrees and about +38 degrees from horizontal. It is also contemplated that in one embodiment, the primary orientation cut sensor 214 may be positioned to detect the orientation cut 202 when the orientation cut 202 is in a cut up orientation, i.e., when the orientation cut is not orientated within range between about −44 degrees and about +44 degrees from horizontal. The secondary orientation cut sensor 418 is configured to detect the presence of the orientation cut 202 when the orientation cut 202 is located in front of the secondary orientation cut sensor 418. The substrate presence sensor 212 is configured to detect the presence of the substrate 122 by using light projected over a field between the sensor 212 and the substrate 122. Similarly, the orientation cut sensors 214, 418 are configured to detect the presence of the orientation cut 202 by using light projected over a distance between the sensor 214, 418 and the orientation cut 202. The sensors 212, 214 and 418 look for changes in the field or return signal. The sensors 212, 214 and 418 may be photoelectric sensors, proximity sensors or other suitable sensors for detecting the presence of the substrate 122 or the orientation cut 202.

In one embodiment, the substrate presence sensor 212 and the primary orientation cut sensor 214 are held by a sensor bracket 230. The sensor bracket 230 is configured to position the sensors 212, 214 relative to the substrate holder assembly 204, such that the sensor 214 can detect the presence of orientation cut 202 of the substrate 122. The sensor bracket 230 is configured to span a front side 232 and a back side 234 of the substrate holder assembly 204. While FIG. 2 depicts the sensors 214, 214 coupled to the sensor bracket 230, it is contemplated that the sensors 212, 214 may be coupled to the substrate position aligner 180 in any other suitable fashion. For example, the sensors 214, 214 may be coupled to and extend directly from the first and second plate 216, 218 on the front and back side 232, 234 of the substrate holder assembly 204.

Figure 3:
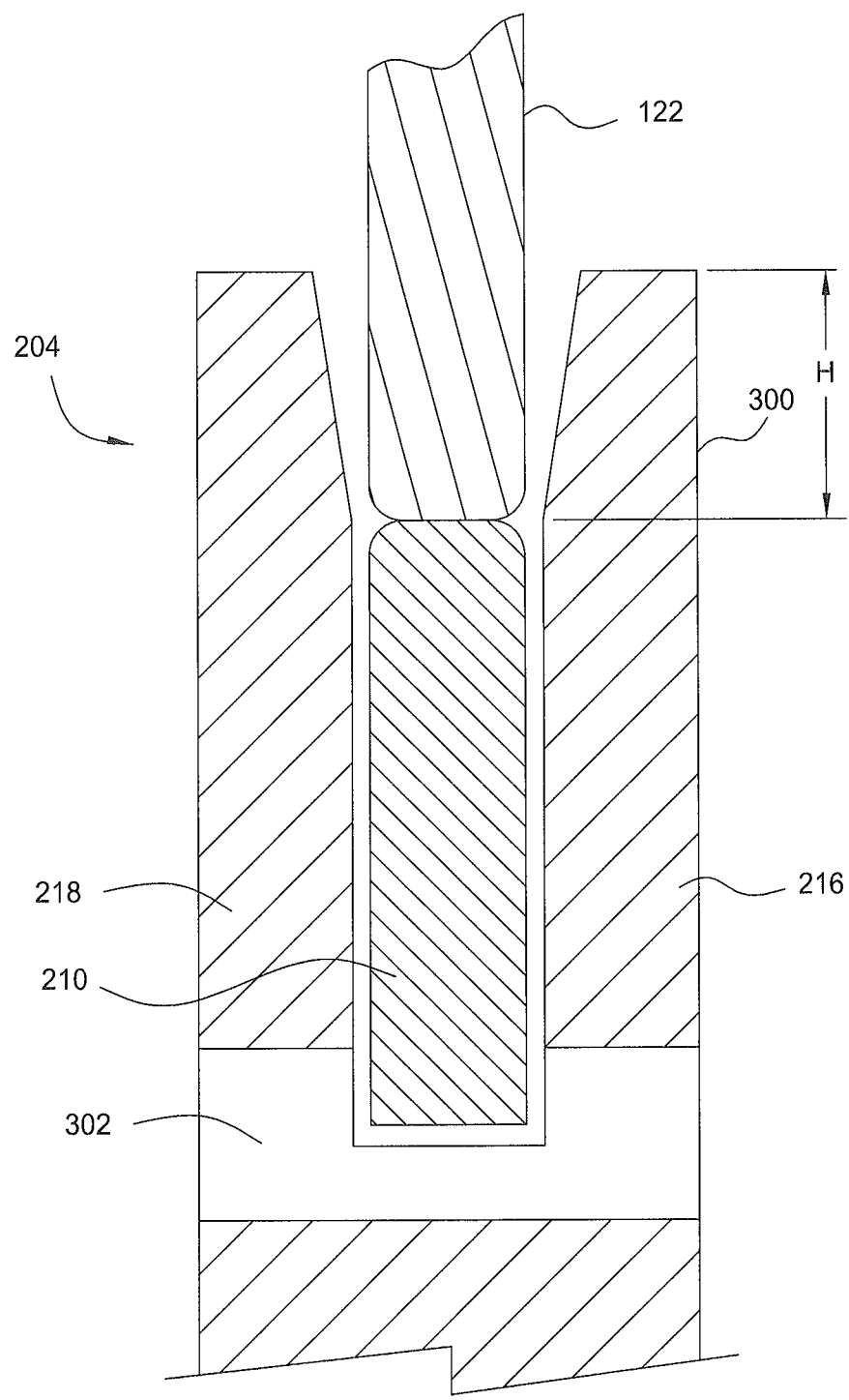
FIG. 3 is a cross-sectional view of the substrate position aligner of FIG. 1.

FIG. 3 is a cross-sectional view of the substrate 122 placed in the substrate holder assembly 204. In one embodiment, the distance between the top of the idler rollers 210 of the substrate 122 and the top adjacent edge of plates 216, 218 forms a tapered lip 300. Lip 300 has a height "H" between about 0.5 mm and about 1.5 mm, for example about 1 mm. The lip 300 is configured to house the bottom of the substrate 122, such that the weight and height of the substrate 122 is balanced as it is held vertically in the substrate holder assembly 204.

FIGS. 4A-4E are schematic views of an aligning sequence that may be practiced using the substrate position aligner 180. In FIG. 4A, the substrate 122 is positioned on the drive roller 208 and idler rollers 210 between the lips 300 of the first and second plates 216, 218 (the sensor bracket 230 is not shown for clarity in FIGS. 4A-4E). The substrate presence sensor 212 detects the presence of the substrate 122 in the substrate holder assembly 204. When the substrate presence sensor 212 indicates the presence of the substrate 122, the primary orientation cut sensor 214 determines if the orientation cut 202 is present. If the primary orientation cut sensor 214 detects the presence of the orientation cut 202, as shown in FIG. 4D, an edge gripper 402 of the robot 168 will properly grip the lateral edges of the substrate 122 while avoiding the orientation cut 202. However, if the orientation cut 202 is not present (i.e., detected by the sensor 214, 418), as shown in FIGS. 4B-40, the substrate rotation mechanism 206 initiates rotation of the drive roller 208 to rotate the substrate 122. In the embodiments depicted in FIGS. 4B-4C, the drive roller 208 is rotated in a clock-wise motion. In one embodiment, the substrate rotation mechanism 206 is configured to rotate the substrate 122 at a speed of about 170 rpm to about 190 rpm, for example 180 rpm. The substrate rotation mechanism 206 will continue to rotate the substrate 122, as shown in FIGS. 4B-4C, until the primary orientation cut sensor 214 detects the presence of the orientation cut 202 at the bottom of the substrate 122 in a cut-down orientation, i.e., vertically aligned with the center of the substrate 122, as shown in FIG. 4D, so that the grippers 402 can securely engage the perimeter of the substrate 122 clear of the orientation cut 202.

In one embodiment, as shown in FIGS. 4A-4E, the secondary orientation cut sensor 418 is located adjacent to and offset from the primary orientation cut sensor 214. The sensors 214, 418 are spaced substantially equidistant from the center of substrate rotation 236 defined by the arc defined by the idler rollers 210. The drive roller 208 may be positioned between the sensors, 418 and 214. The secondary orientation cut sensor 418 functions the same as the primary orientation cut sensor 214. If the primary orientation cut sensor 214 does not detect the presence of the orientation cut 202, the substrate rotation mechanism 206 will continue to rotate the substrate 122 until the orientation cut 202 is detected or until a predetermined time, such as about five seconds, have lapsed. The secondary orientation cut sensor 418 functions to detect the orientation cut 202 in situations where the orientation cut 202 prevents contact of the substrate 122 and drive roller 208, thus preventing the substrate 122 from rotating to a position where the orientation cut 202 may be detected by the sensor 214. In one embodiment, the orientation cut 202 is adjacent a cut-down orientation as shown in FIG. 4E and clear of the grippers 402. So that the cut 122 stays clear of the gripper 402, the sensor 418 may be located in some embodiments at an angle no greater than 80 degrees from vertical relative to the center of the aligner 180. If the secondary orientation cut sensor 418 detects the presence of the orientation cut 202, the substrate 122 will be in a cut down position that allows the robot 168 to properly grip the substrate 122 at its perimeter while avoiding the orientation cut 202. However, if both the primary and secondary orientation cut sensors 214, 418 do not detect the orientation cut 202, the substrate position aligner 180 will issue an alert for activating hardware fault. In one embodiment, the substrate position aligner 180 will issue an alert if the presence of the orientation cut 202 is not detected after a pre-determined amount of time or a pre-determined amount of substrate rotation.

The above described substrate position aligner advantageously aligns the substrate in a cut down orientation which allows an end effector or robot's grippers to properly grip a substrate while avoiding its orientation cut. This is particularly beneficial in the processing of 150 mm substrates, where the length of the orientation cut is relatively long e.g., the same as a cut in a 200 mm substrate and gripping a non-oriented substrate may be problematic.

While the foregoing is directed to embodiments of the present invention, other and further embodiments of the invention may be devised without departing from the basic scope thereof, and the scope thereof is determined by the claims that follow.

What is claimed is:

1. A substrate position aligner comprising:
   a substrate holding assembly configured to hold a substrate in a vertical orientation;
   a plurality of rollers comprising at least two idler rollers and a drive roller, each roller having a point on its perimeter spaced on a common radius from a center of substrate rotation defined within the substrate holding assembly;
   a rotation mechanism configured to selectively rotate the drive roller; and
   a sensor positioned approximately on the common radius and configured to detect presence of an orientation cut in the substrate when the orientation cut is not orientated within a range between about −44 degrees and about +44 degrees from horizontal.

2. The substrate position aligner of claim 1, wherein substrate holding assembly comprises a crescent shaped body having a first plate and a second plate configured to hold the substrate therebetween.

3. The substrate position aligner of claim 2, wherein the crescent shaped body is fabricated from ceramic or polyetheretherketone.

4. The substrate position aligner of claim 1, wherein the common radius is about 75 mm.

5. The substrate position aligner of claim 1, wherein a radial distance between the idler rollers and the drive roller is between about 59 mm to about 65 mm.

6. The substrate position aligner of claim 2, wherein a distance between a top of the drive roller and top adjacent edges of the first and second plates defines a tapered lip.

7. The substrate position aligner of claim 6, wherein the tapered lip has a height between about 0.5 mm and about 1.5 mm.

8. The substrate position aligner of claim 1, wherein the rotation mechanism is a motor or an actuator.

9. The substrate position aligner of claim 1, wherein the sensor is configured to detect a presence of the orientation cut in the substrate by using a light projected between the sensor and the orientation cut in the substrate.

10. A substrate position aligner comprising:
    a substrate holding assembly configured to hold a substrate in a vertical orientation, wherein the substrate holding assembly has a center of substrate rotation defined within the substrate holding assembly;

at least three idler rollers and a drive roller, wherein each roller has a point on its perimeter spaced on a common radius from the center of substrate rotation;

a rotation mechanism configured to rotate the drive rollers;

a first sensor configured to detect the substrate when located in the substrate holding assembly; and a second sensor and third sensor each configured to detect a presence of an orientation cut in the substrate when the substrate is adjacent to or in a cut-down orientation.

11. The substrate position aligner of claim 10, wherein the second sensor and third sensor are each configured to detect a presence of the orientation cut in the substrate when the orientation cut is not orientated within a range between about −44 degrees and about +44 degrees from horizontal.

12. The substrate position aligner of claim 10, wherein the second and third sensors are spaced substantially equidistant from the center of substrate rotation and at least one of the second or third sensors is located at angle no greater than about 80 degrees from vertical relative to a center line of the substrate position aligner.

13. The substrate position aligner of claim 11, wherein the drive roller is disposed between the second and third sensors.

14. A method of aligning a substrate having an orientation cut, the method comprising:

placing the substrate on a plurality of rollers, wherein the rollers are distributed such that the substrate is supported on at least two rollers at all times;

sensing a presence of the substrate on the rollers; and sensing a presence of the orientation cut when the orientation cut is not orientated within a range between about −44 degrees and about +44 degrees from horizontal.

15. The method of claim 14, further comprising:

rotating the driver roller until the presence of orientation cut is detected.

16. The method of claim 15, wherein sensing the presence of the orientation cut further comprises sensing a presence of the orientation cut when the orientation cut is not orientated within a range between about −38 degrees and about +38 degrees from horizontal.

17. The method of claim 14, wherein sensing the presence of the substrate includes detecting light between the substrate and a first sensor.

18. The method of claim 17, wherein sensing the presence of the orientation cut includes detecting light between the orientation cut and a second sensor.

19. The method of claim 14, further comprising:

activating a hardware fault when the presence of the orientation cut fails to be sensed after a pre-determined amount of time or a pre-determined amount of substrate rotation.

20. The method of claim 14, wherein sensing the presence of the substrate initiates rotation of the substrate.

* * * * *

UNITED STATES PATENT AND TRADEMARK OFFICE
CERTIFICATE OF CORRECTION

PATENT NO. : 9,218,996 B2
APPLICATION NO. : 14/195343
DATED : December 22, 2015
INVENTOR(S) : Manoj A. Gajendra It is certified that error appears in the above-identified patent and that said Letters Patent is hereby corrected as shown below:

In the Specification

In the Detailed Description:

Column 7, Line 28, please delete "4B-40" and insert --4B-4C-- therefor.

Signed and Sealed this
Nineteenth Day of April, 2016

Michelle K. Lee
*Director of the United States Patent and Trademark Office*